US007442941B2

(12) United States Patent
Qian et al.

(10) Patent No.: US 7,442,941 B2
(45) Date of Patent: Oct. 28, 2008

(54) ION GENERATOR

(75) Inventors: Li Qian, Bei-Jing (CN); Jing Qi, Bei-Jing (CN); Jie Tang, Bei-Jing (CN); Liang Liu, Bei-Jing (CN); Zhao-Fu Hu, Bei-Jing (CN); Pi-Jin Chen, Bei-Jing (CN); Shou-Shan Fan, Bei-Jing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 186 days.

(21) Appl. No.: 11/460,610

(22) Filed: Jul. 27, 2006

(65) Prior Publication Data

US 2007/0114475 A1 May 24, 2007

(30) Foreign Application Priority Data

Oct. 24, 2005 (CN) ........................ 2005 1 0100604

(51) Int. Cl.
*H01J 27/02* (2006.01)
*H01J 37/08* (2006.01)
*G21K 1/02* (2006.01)

(52) U.S. Cl. .................. 250/423 R; 250/426; 250/427; 250/423 F

(58) Field of Classification Search ............. 250/423 R, 250/426, 427
See application file for complete search history.

(56) References Cited

U.S. PATENT DOCUMENTS 5,166,709 A * 11/1992 Kubelik ...................... 347/120

* cited by examiner

*Primary Examiner*—Nikita Wells

(57) ABSTRACT

An ion generator (10) generally includes: a shielding shell (11), a cathode device (16), and an annular anode (14). The shielding shell has a first end (113), an opposite second end (115) and a main body (111) therebetween. The first end has an electron-input hole (13). The second end has an ion-output hole (15). The main body has a gas inlet (170) for introducing an ionizable gas (170). The cathode device faces the electron-input hole for emitting electrons to enter the shielding shell so as to ionize the ionizable gas thereby generating ions. The cathode device includes a conductive base (160) and at least one field emitter (161) thereon. The annular anode is arranged in the shielding shell. The anode is aligned with the ion-output hole.

19 Claims, 6 Drawing Sheets

ION GENERATOR

DESCRIPTION

1. Field of the Invention

The present invention relates to ion generators, and particularly to an ion generator having a high ion generation efficiency.

2. Description of Related Art

An ion gun is generally a scientific instrument that generates ions, and forms them into a usable beam. Ion guns are used in a wide variety of basic research and industrial applications: from microscopic surface physics studies and semiconductor processing to large spacecraft testing and range in size from about a centimeter to over half a meter long. Many kinds of ions can be produced depending on the gun, including positive ions of most gases, reactive ions, and alkali metal ions. Some guns are flood guns and produce a wide-angled beam, while others are focusable and produce a small spot.

Conventionally, the ion gun includes an ion source that generates the ions either directly from an alkali metal, or indirectly by generating electrons which then ionize a gas. There are three different basic processes by which ions are generated in the ion guns: electron impact gas ionization, microwave gas ionization, and alkali metal solid surface ionization.

The gas ionization ion guns always have a cathode which emits electrons when heated by the source power supply. An inert or a reactive gas, such as argon or oxygen, is introduced form an external tank via a gas feedthrough into the region inside the ion gun near the filament. The electrons emitted from the cathode are accelerated into the gas region and collide with the neutral gas molecules to generate ions.

The number of ions produced by electron impact ionization depends mainly on the number of the electrons emitted, their energy, the type of gas and the number of gas molecules present to be ionized.

However, as discussed above, the cathode utilized in the ion gun is a thermal cathode which has a weak stability of electron emission. Further, the thermal cathode is constantly consumed during the electron emission process. Hence, the thermal cathode has a short service life, and needs to be replaced frequently. As a result, ion generation efficiency will be decreased.

What is needed, therefore is to provide an ion generator having a high ion generation efficiency.

SUMMARY OF THE INVENTION

According to an exemplary embodiment, an ion generator generally includes: a shielding shell, a cathode device, and an annular anode. The shielding shell has a first end, an opposite second end and a main body therebetween. The first end has an electron-input hole. The second end has an ion-output hole. The main body has a gas inlet configured for introducing an ionizable gas into the shielding shell. The cathode device faces the electron-input hole for emitting electrons to enter the shielding shell so as to ionize the ionizable gas thereby generating ions. The cathode device includes a conductive base and at least one field emitter thereon. The annular anode is arranged in the shielding shell. The anode is aligned with the ion-output hole.

These and other features, aspects, and advantages of the present ion generator will become more apparent from the following detailed description and claims, and the accompanying drawings.

BRIEF DESCRIPTION OF THE DRAWINGS

Many aspects of the present ion generator can be better understood with reference to the following drawings. The components in the drawings are not necessarily drawn to scale, the emphasis instead being placed upon clearly illustrating the principles of the present ion generator. Moreover, in the drawings, like reference numerals designate corresponding parts throughout the several views.

DETAILED DESCRIPTION OF THE INVENTION

Figure 1:
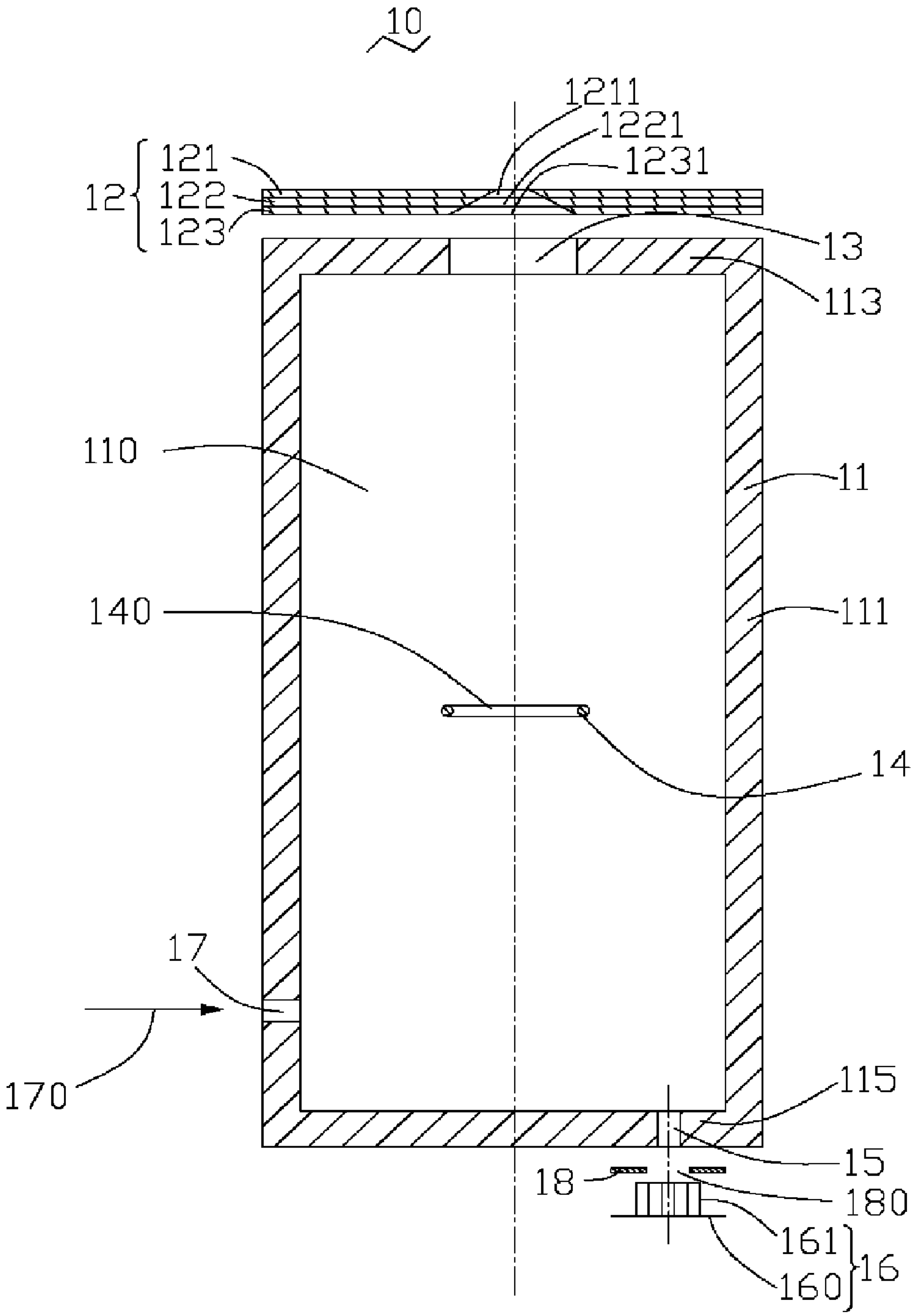
FIG. 1 is a schematic, lengthwise cross-sectional view of an ion generator in accordance with a first embodiment, the ion generator including a cathode device.

Referring to FIG. 1, an ion generator 10 is shown in accordance with a first embodiment. The ion generator 10 generally includes a shielding shell 11, an anode 14 and a cathode device 16. The anode 14 is arranged in the shielding shell 11, and is electrically insulated from the shielding shell 11. The cathode device 16 is arranged outside the shielding shell 11 for emitting electrons to enter the shielding shell 11.

The shielding shell 11 has a first end 115, an opposite second end 113 and a main body 111 therebetween. The first end 115 has an electron-input hole 15 defined therein. The second end 113 has an ion-output hole 13 defined therein. The main body 111 has a gas inlet 17 defined therein for introducing an ionizable gas 170. An ionization chamber 110 is supported by the first end 115, the second end 113 and the main body 111, for receiving the electrons emitted from the cathode device 16 and an ionizable gas 170.

In this embodiment, the shielding shell 11 is a barrel, has a diameter of about 24 millimeters and a height of 50 millimeters. The shielding shell 11 is preferably made of molybdenum, steel, titanium or the like. The electron-input hole 15 has a diameter of about 1 millimeter, and has a different axis from the shielding shell 11. The ion-output hole 13 has a diameter of about 4 millimeters, and is coaxial with the shielding shell 11. The gas inlet 17 is preferably adjacent to the first end 115 of the shielding shell 11, therefore the ionizable gas 170 distributes more uniformly in the ionization chamber 110 which is advantageous to improving impact between the electrons and molecules of the ionizable gas 170 so as to obtain a higher ionizing efficiency. The ionizable gas 170 can be, for example, argon gas, hydrogen gas, helium gas, xenon gas, or a combination of two or more of the above gases.

Figure 2:
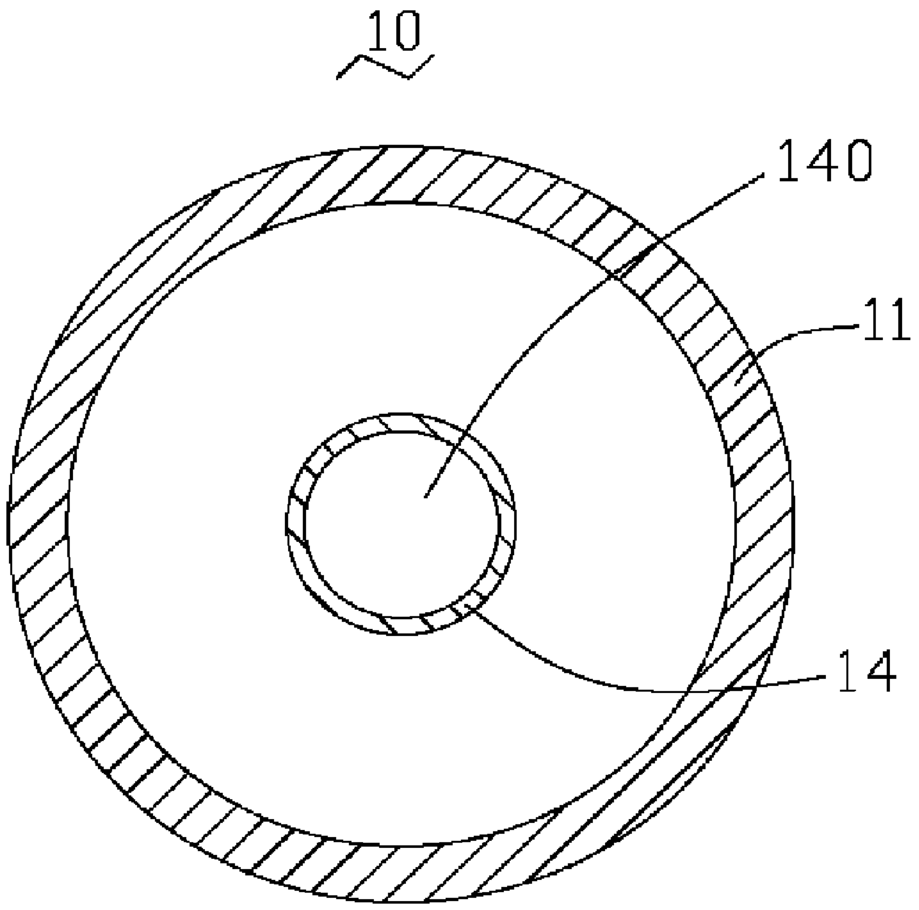
FIG. 2 is a schematic, transverse cross-sectional view of the ion generator of FIG. 1.

Referring to FIGS. 1 and 2, the anode 14 is generally annular, and has a through hole 140 for allowing the electrons and ions to pass therethrough. The anode 14 is coaxial with the shielding shell 11 and the ion-output hole 13 of the shielding shell 11. The anode 14 is misaligned with the electron-input hole 15 of the shielding shell 11. Therefore, electrons emitted from the cathode device 16 enter into the shielding shell 11 in a direction away from an axis of the through hole 140 of the anode 14 in a manner such that the electrons can keep moving for a longer time and an ion generation efficiency of the ion generator 10 is improved. Furthermore, a probability that the electrons come back and exit through the electron-input hole 115 is accordingly decreased.

Preferably, the anode 14 is a metal ring, which is advantageous to decrease the amount of the electrons captured by the anode 14. As a result, most electrons have longer moving tracks, and an ion generation efficiency of the ion generator 10 is improved. A wall of the metal ring can have a thickness in a range from 0.1 millimeter to 0.5 millimeters. The through hole 140 can have a diameter of about 8 millimeters. The anode 14 is arranged in a distance of about 25 millimeters away from the electron-input hole 15 of the shielding shell 111.

In an alternate embodiment the anode 14 can have other shapes, such as a barrel or otherwise suitable shape. The wall of the anode 14 also could have other cross-sectioned shapes in an axial/radial direction of the shielding shell 11 such as, for example, triangular, rectangular, or polygonal.

The cathode device 16 includes a conductive base 160 and at least one field emitter 161 thereon. The field emitters extend toward the electron-input hole 15, and can emit electrons which enter the shielding shell 11 and cause ionization of the gas 170 thereby generating ions. A material of the field emitters 161 may be selected from carbon nanotubes, diamond, diamond-like carbon (DLC) and silicon. Alternatively, the field emitter 161 may be comprised of a pointed metal material.

A grid electrode 18 is arranged between the cathode device 16 and the electron-input hole 15 of the shielding shell 11, for promoting extraction of the electrons from the cathode device 16 and guiding the electrons to enter the shielding shell 11 through the electron-input hole 15. The grid electrode 18 has a grid hole 180 corresponding to the electron-input hole 15. The grid hole 180 preferably has a common or broader thickness than the electron-input hole 15, and is coaxial with the electron-input hole 15, which is advantageous for passing as much electrons as possible therethrough.

Otherwise, the ion generator 10 may further include an aperture lens 12 formed on an outer surface of the second end 113 of the shielding shell 11, for focusing the ions exiting from the ion-output hole 13 of the shielding shell 11. The aperture lens 12 includes three electrodes 121, 122, 123 with respective through holes 1211, 1221, 1231. The through holes 1211, 1221, 1231 are preferably coaxial with the ion-output hole 13.

In operation, due to the extraction and guidance effects of the grid electrode, a plurality of electrons are emitted from the cathode device 16 and enter the ionization chamber 110 of the shielding shell 11 through the electron-input hole 15. The ionization chamber 110 can be pretreated to be a substantial vacuum in advance, and the ionizable gas 170 can then be introduced.

Figure 3:
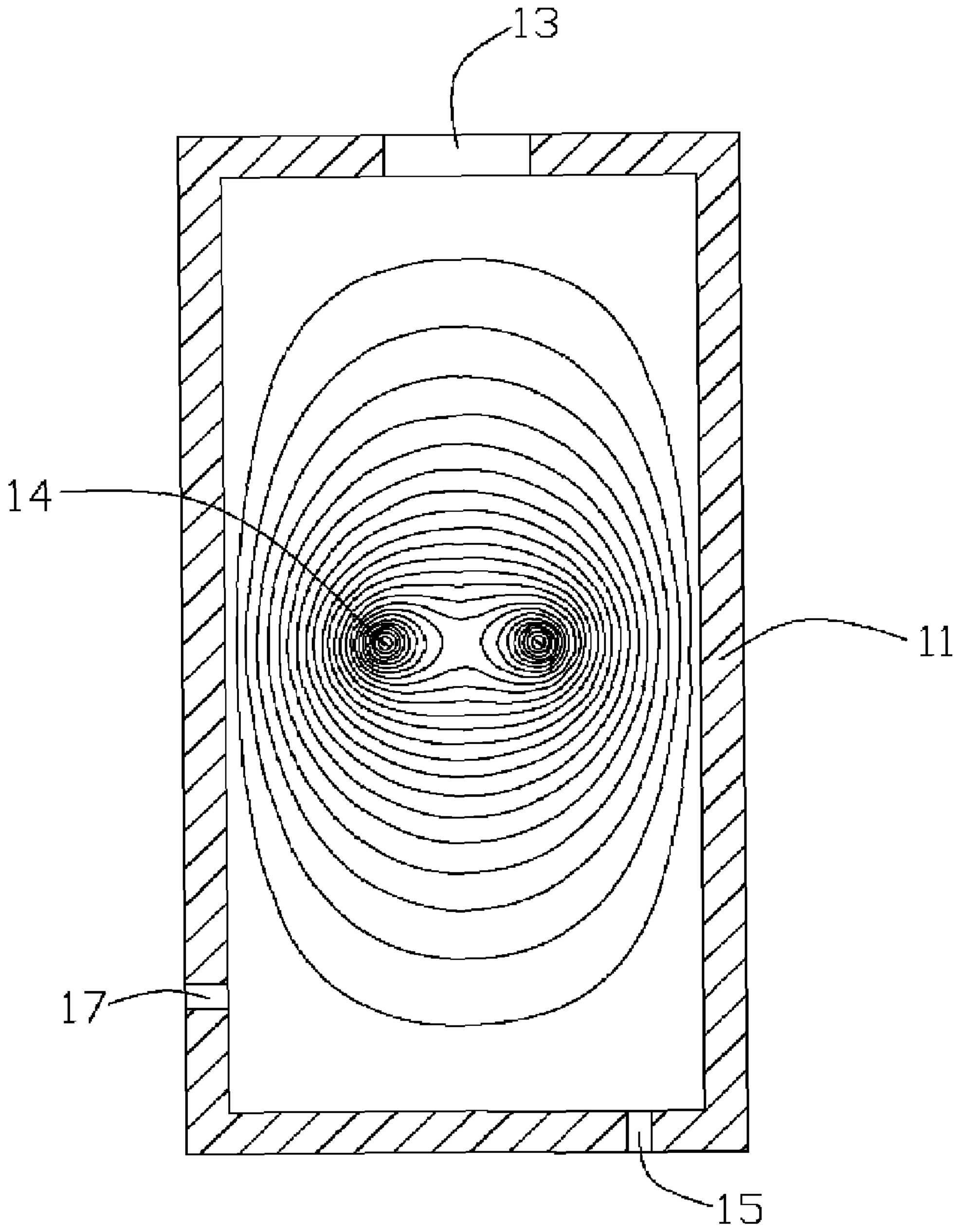
FIG. 3 is a schematic view showing a potential distribution associated with the ion generator of FIG. 1.
Figure 4:
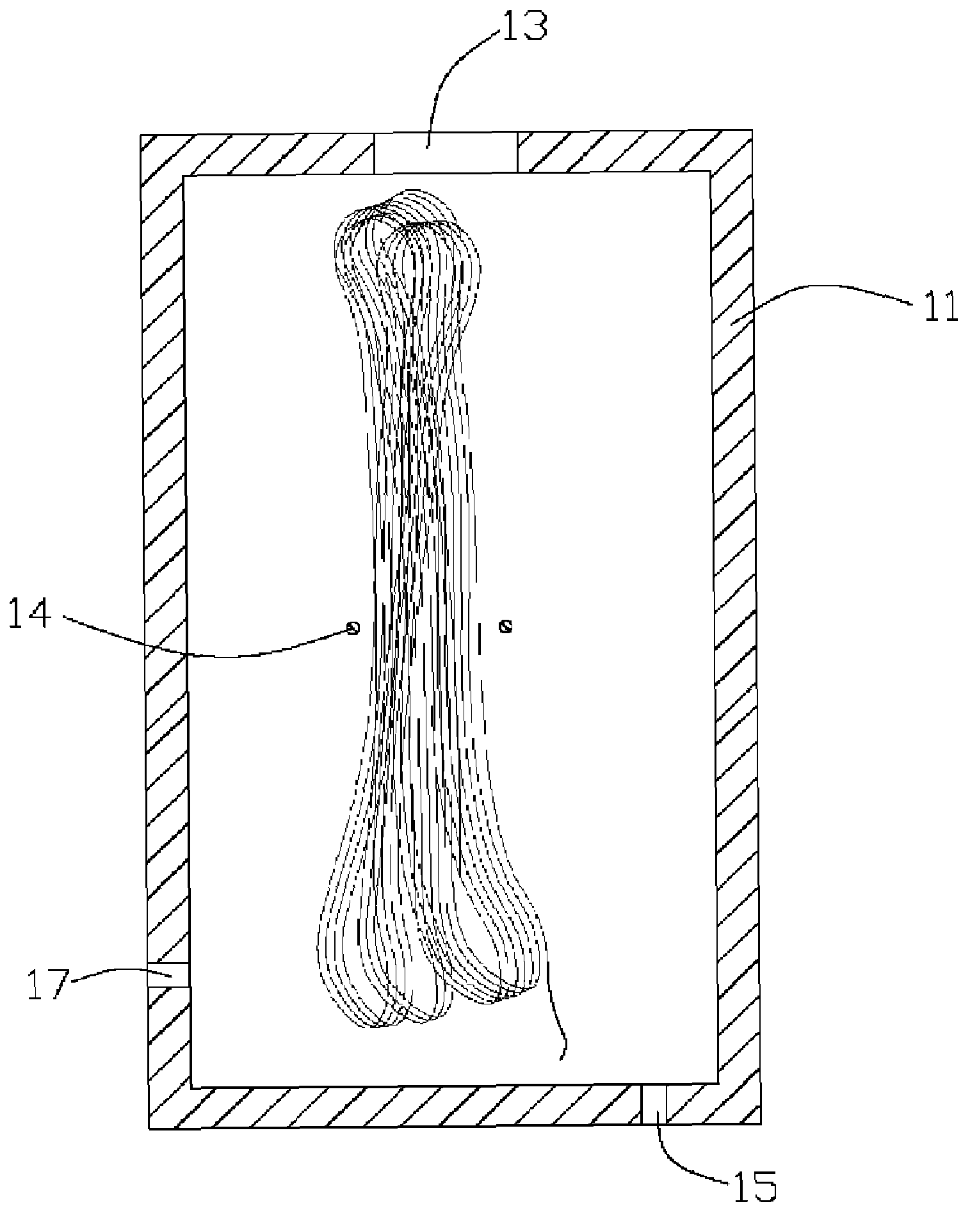
FIG. 4 is a schematic view showing electron tracks associated with the ion generator of FIG. 1.

Referring to FIGS. 3 and 4, a saddle-shaped electric field can be generated in the ionization chamber 110 by a potential difference between the anode 14 and the shielding shell 11. The elections can travel a relative long distance in the saddle electric field and then collide with the molecules of the ionizable gas 170 to cause an ionization of the ionizable gas 170 and generate ions. In fact, the elections' long flight time will increase the probability and instances of the collisions between the elections and the molecules of the ionizable gas 170. Accordingly, more ions will be generated, and an ionization efficiency of the ion generator 10 will be improved.

The ions exit from the shielding shell 11 via the ion-output hole 13 thereof. The emitted ions are finally focused to be an ion beam by the aperture lens 12.

In this embodiment, the cathode device 16 can have a potential of about 10 volts. The grid electrode 18 can have a potential of about several dozen volts. The shielding shell 11 can be grounded. The anode 14 can have a potential in a range from about 500 volts to about 1000 volts. It should be noted that the potentials of the cathode device 16, the grid electrode 18, and the anode 14 should be adjusted according to particular circumstances, such as differing emission capabilities of the field emitters 161, distances among the electrodes 14, 16, 18, actual size of the ion generator 10, and other factors.

Figure 5:
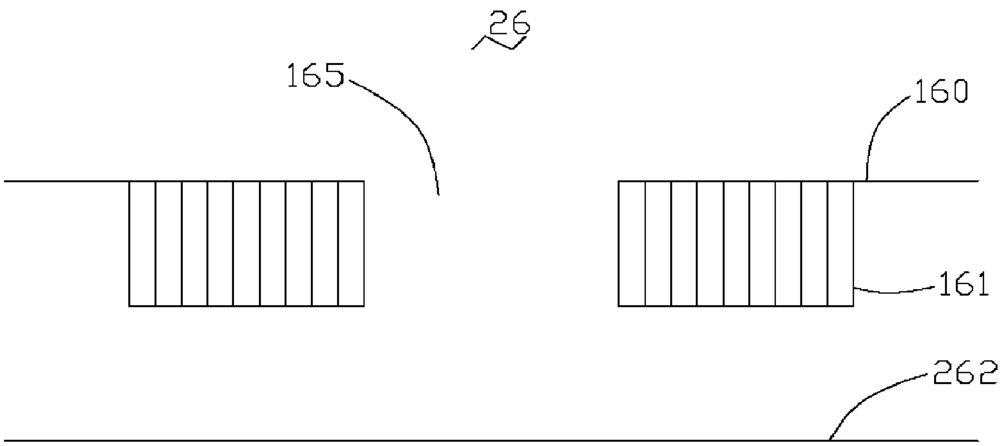
FIG. 5 is a schematic, cross-sectional view of an exemplary cathode device for use in the ion generator in accordance with a second embodiment.

Referring to FIG. 5, a cathode device 26 is shown in accordance with a second embodiment of the cathode device 16 of the ion generator 10. The cathode device 26 includes a conductive base 160, at least one field emitter 161, and a planar secondary electron-emitting source 262. The field emitters 160 extend from the conductive base 160, and face the secondary electron-emitting source 262. In operation, the secondary electron-emitting source 262 has a higher potential than the field emitters 161. As a result, the electrons emitted from the field emitters 161 impact the secondary electron-emitting source 262 and cause the secondary electron-emitting source 262 to emit more electrons. Accordingly, the electrons, as discussed above, can enter the shielding shell 11 via the electron-input hole 115. Preferably, the secondary electron-emitting source 262 is comprised of copper or platinum.

Otherwise, the conductive base 160 having the field emitters 161 thereon has a through hole 165, for passing the electrons emitted from the field emitters 161 and the secondary electron-emitting source 262 therethrough. The through hole 165 preferably corresponds to the grid hole 180 and the electron-input hole 15, and/or is coaxial with them. Alternatively the conductive base 160 can have two or more through holes 165, or more than one conductive base 160 can be provided, each of which is spaced away from its neighboring one.

Figure 6:
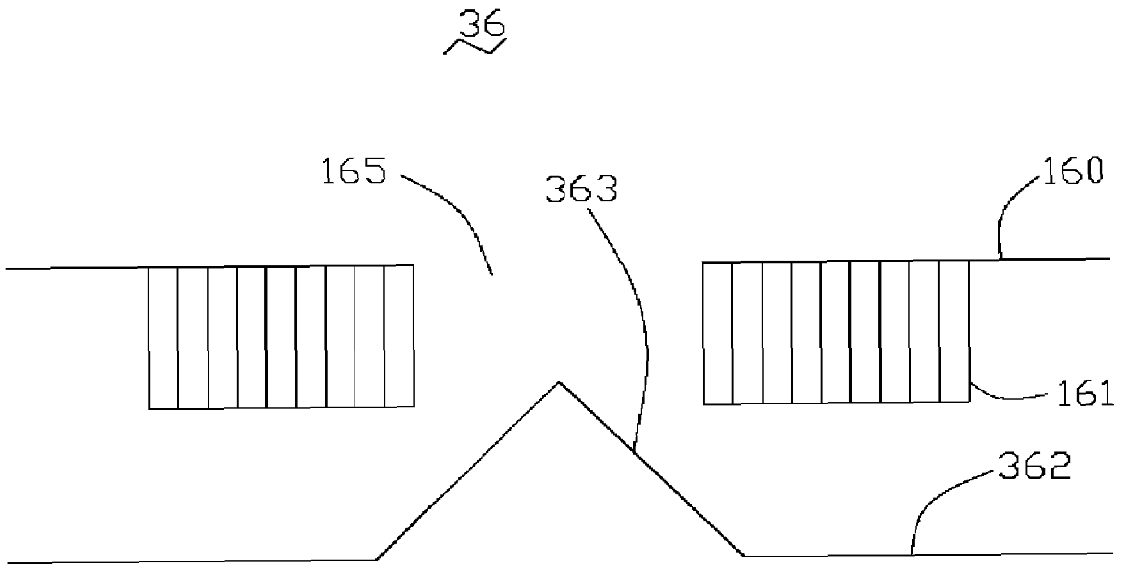
FIG. 6 is a schematic, cross-sectional view of an alternative cathode device for use in the ion generator in accordance with a third embodiment.

Referring to FIG. 6, a cathode device 36 is shown in accordance with a third embodiment of the cathode device 16 of the ion generator 10. The cathode device 36 includes a secondary electron-emitting source 362 having at least one secondary electron emitting tip 363 extending toward the through hole 165 of the conductive base 160 and/or the electron-input hole 15 of the shielding shell 11. The at least one secondary electron emitting tip 363 could be a protrusion of the secondary electron-emitting source 362. Alternatively, the secondary electron-emitting source 362 can be formed by depositing the secondary electron emitting tip 363 on a conductive layer.

Finally, while the present invention has been described with reference to particular embodiments, the description is illustrative of the invention and is not to be construed as limiting the invention. Therefore, various modifications can be made to the embodiments by those skilled in the art without departing from the true spirit and scope of the invention as defined by the appended claims.

What is claimed is:

1. An ion generator comprising:

a shielding shell having a first end, an opposite second end and a main body, the first end having an electron-input hole, the second end having an ion-output hole, the main body having a gas inlet configured for introducing an ionizable gas into the shielding shell;

a cathode device disposed facing the electron-input hole, configured for emitting electrons into the shielding shell through the electron-input hole so as to ionize the ionizable gas thereby generating ions, the cathode device including a conductive base and at least one field emitter; and an annular anode arranged in the shielding shell, the annular anode being aligned with the ion-output hole.

2. The ion generator according to claim 1, further comprising a grid electrode arranged between the cathode device and the electron-input hole of the shield shell, the grid electrode being configured for promoting extraction of the electrons from the cathode device.

3. The ion generator according to claim 2, wherein a shielding shell is tubular and the annular anode coaxially disposed in the shielding shell.

4. The ion generator according to claim 1, wherein the field emitters is comprised of a material selected from the group consisting of carbon nanotubes, diamond, diamond-like carbon, silicon, and metal.

5. The ion generator according to claim 1, wherein the cathode device includes a secondary electron-emitting source, and the at least one field emitter faces the secondary electron-emitting source.

6. The ion generator according to claim 5, wherein the secondary electron-emitting source is comprised of copper or platinum.

7. The ion generator according to claim 5, wherein the secondary electron-emitting source includes at least one tip extending toward the electron-input hole.

8. The ion generator according to claim 1, wherein the gas inlet is configured to be adjacent to the first end of the shielding shell.

9. The ion generator according to claim 1, wherein the annular anode and the ion-output hole of the shielding shell are coaxial.

10. The ion generator according to claim 1, wherein the annular anode is misaligned with the electron-input hole of the shielding shell.

11. The ion generator according to claim 1, further comprising an aperture lens arranged on the second end of the shielding shell, the aperture lens configured for focusing the ions exiting from the ion-output hole of the shielding shell.

12. The ion generator according to claim 9, wherein a thickness of a wall of the annular anode is in a range from 0.1 millimeters to 0.5 millimeters.

13. An ion generator comprising:

a field emission cathode device configured for emitting electrons therefrom; and a shell including an ionization chamber and an annular anode arranged therein, the ionization chamber being configured for receiving the electrons emitted from the field emission cathode device and an ionizable gas, the anode and the shell being configured for cooperatively forming a saddle electric field in the ionization chamber.

14. The ion generator according to claim 13, further comprising a grid electrode arranged between the cathode device and the electron-input hole of the shield shell, the grid electrode being configured for promoting extraction of the electrons from the cathode device.

15. The ion generator according to claim 13, wherein the field emission cathode device includes a conductive base and a plurality of a field emitters formed thereon, the field emitters configured for emitting the electron input into the ionization chamber of the shell.

16. The ion generator according to claim 13, wherein the field emission cathode device includes a field emitter, and a secondary electron emitter facing each other, the secondary electron emitter has a higher potential than the field emitter such that electrons emitted from the field emitter impact the secondary electron emitter to emit the electrons input in the ionization chamber of the shell.

17. The ion generator according to claim 13, wherein the annular anode is misaligned with the electron-input hole of the shielding shell.

18. The ion generator according to claim 13, wherein a thickness of a wall of the annular anode is in a range from 0.1 millimeters to 0.5 millimeters.

19. An ion generator comprising:

an elongated cylindrical shell having an electron-input hole at a first end thereof, an ion-output hole at an opposite second end thereof, and a gas inlet configured for introducing an ionizable gas thereinto;

an annular anode coaxially disposed within the shell, the annular anode being misaligned with the electron-input hole; and a cathode device disposed adjacent the electron-input hole, the cathode being configured for emitting electrons into the shielding shell through the electron-input hole.

* * * * *